United States Patent [19]

Yoshida et al.

[11] Patent Number: 4,941,148
[45] Date of Patent: Jul. 10, 1990

[54] SEMICONDUCTOR LASER ELEMENT WITH A SINGLE LONGITUDINAL OSCILLATION MODE

[75] Inventors: Toshihiko Yoshida, Tenri; Haruhisa Takiguchi; Shinji Kaneiwa, both of Nara; Hiroaki Kudo, Tenri, all of Japan

[73] Assignee: Sharp Kabushiki Kaisha, Osaka, Japan

[21] Appl. No.: 119,780

[22] Filed: Nov. 12, 1987

[30] Foreign Application Priority Data

Nov. 12, 1986 [JP] Japan .................. 61-270571

[51] Int. Cl.$^5$ .................. H01S 3/08; H01S 3/19
[52] U.S. Cl. .................. 372/96; 372/45; 372/46
[58] Field of Search .................. 372/43–46, 372/96

[56] References Cited

U.S. PATENT DOCUMENTS

| 4,023,993 | 5/1977 | Scifres et al. .................. 372/44 |
| 4,653,058 | 3/1987 | Akiba et al. .................. 372/96 |
| 4,694,461 | 9/1987 | Yano et al. .................. 372/46 |

FOREIGN PATENT DOCUMENTS

| 0158987 | 9/1983 | Japan .................. 372/96 |
| 0196089 | 11/1983 | Japan .................. 372/45 |
| 0225584 | 12/1984 | Japan .................. 372/96 |
| 0010688 | 1/1985 | Japan .................. 372/96 |
| 0132380 | 7/1985 | Japan .................. 372/96 |
| 0023386 | 1/1986 | Japan .................. 372/45 |
| 0184894 | 8/1986 | Japan .................. 372/45 |
| 0002585 | 1/1987 | Japan .................. 372/96 |
| 0084583 | 4/1987 | Japan .................. 372/96 |
| 0227087 | 9/1988 | Japan .................. 372/96 |
| 2126780A | 3/1984 | United Kingdom . |

OTHER PUBLICATIONS

Harris et al; "Distributed Feedback Semiconductor Injection Laser"; vol. 16, No. 1, Jun. 1976; IBM Tech. Disclosure Bulletin, pp. 171–172.

*Primary Examiner*—William L. Sikes
*Assistant Examiner*—Georgia Y. Epps

[57] ABSTRACT

A semiconductor laser element of the present invention provides a double hetero junction structure having two clad layers and an active layer formed between the two clad layers. High resistance regions are formed vertically to the light propagating direction at almost the same interval as the light wavelength in at least one of the two clad layers. The high resistance regions form a periodic current blocking structure so the semiconductor laser element may oscillate in a single longitudinal mode even in a non-steady state operation.

38 Claims, 1 Drawing Sheet

SEMICONDUCTOR LASER ELEMENT WITH A SINGLE LONGITUDINAL OSCILLATION MODE

BACKGROUND OF THE INVENTION

The present invention relates to a distributed feedback type semiconductor laser that is capable of oscillating in a single longitudinal mode by changing the gain of the laser resonator in the same direction as the propagation of the laser light at almost the same interval as the laser light wavelength.

It has been verified recently that a distributed feedback type semiconductor laser device whose angle of refraction is changed in the same direction as the laser beam propagation at almost the same interval as the laser light wavelength is effective for realizing single longitudinal mode oscillation. The distributed feedback type semiconductor laser element, having its angle of refraction changed, provides two longitudinal modes of basically equal gain. However, in a steady state operation where constant current is allowed to flow at all times, oscillation is assumed to take place in either of the two longitudinal modes due to an inherent asymmetry of the resonator. In most distributed feedback type semiconductor laser elements, one of the two cleavage planes is etched obliquely to prevent the two cleavage planes from constituting a Fabry-Perot resonator. Therefore, the asymmetry of the resonator increases significantly and a stable single longitudinal mode oscillation is realized.

However, when the above conventional distributed feedback type semiconductor laser element is used as a light source for optical communication, it is operated in a non-steady state with the amount of exciting current modulating rapidly. In such a non-steady state operation, the asymmetry of the resonator is considered to change continuously so that the laser element does not always oscillate in a single mode. Actually, oscillation spectrum expansions and discontinuous oscillation mode changes have been observed.

SUMMARY OF THE INVENTION

In view of the above, the object of the present invention is to provide a distributed feedback type semiconductor laser element which oscillates in a single longitudinal mode even in a non-steady state operation without causing oscillation spectrum expansions and discontinuous oscillation mode changes.

According to the present invention, a semiconductor laser element of a double hetero junction structure having two clad layers and an active layer formed between the two clad layers. High resistance regions are formed in at least one of the two clad layers, at almost the same interval as the laser light wavelength in a vertical direction to the light propagating direction.

Since the upper or lower clad layer has high resistance regions formed vertically to the light propagating direction at the same period as the light wavelength to constitute a periodic current blocking structure, the amount of injected current changes periodically according to the light wavelength which allows the gain in the resonator, with respect to the laser light to vary periodically. Accordingly, with only one longitudinal oscillation mode of the largest gain, the semiconductor laser element of the present invention oscillates in a single longitudinal mode even in a non-steady state operation.

According to the present invention, as mentioned above, a periodic current blocking structure is formed by the high resistance regions which permits the gain in the resonator to change periodically, and the oscillation of the semiconductor laser element in a single longitudinal mode can be achieved even in a non-steady state operation. As the laser element oscillates in a single longitudinal mode, an oscillation spectrum does not expand and an oscillation mode does not change intermittently even in a non-steady state operation.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENT

Embodiments of the present invention will be described in detail with reference to the accompanying drawings. It is not our intention for the present invention to be limited to the following embodiments.

Figure 1:
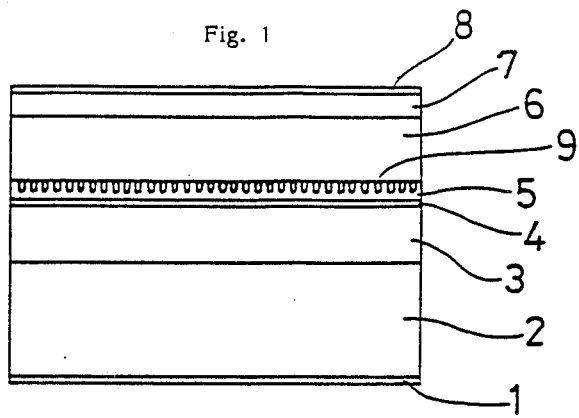
FIG. 1 is a side view of a distributed feedback type semiconductor laser element of an embodiment of the present invention.

FIG. 1 is a side view of a distributed feedback type semiconductor laser element of one embodiment of the present invention. A 2 $\mu$m thick p-type InP clad layer 3, a 0.15 $\mu$m thick undoped InGaAsP active layer 4 and a 0.3 $\mu$m thick n-type InP clad layer 5 are sequentially grown on a p-type InP substrate 2 in the normal liquid phase growth method. Fe ions focused into a width of about 0.15 $\mu$m are shot in the n-type InP clad layer 5 from above the upper side in a linear direction vertical to the light propagating direction by using a Focused Iron Beam (FIB) method, to form a high resistance region 9 which is different in resistance from the rest of the n-type InP clad layer 5. The Fe ions are shot in the 3-n-type InP clad layer 5 to a depth of 0.2 to 0.3 $\mu$m to be close to the InGaAsP active layer 4. This operation is repeated to produce high resistance regions 9 at intervals of about 0.23 $\mu$m or almost the same period as the laser light wavelength in a vertical direction to the light propagating direction.

Another 2 $\mu$m thick n-type InP clad layer 6 and a 0.7 $\mu$m thick n-type InGaAsP contact layer 7 are grown by the liquid phase growth method on the n-type InP clad layer 5 in which the high resistance regions 9 have been formed. Thereafter, an Au/Zn electrode 1 and an Au/Ge/Ni electrode 8 are deposited by evaporation on the bottom side of the p-type InP substrate 2 and on the n-type InGaAsP contact layer 7, respectively, and alloyed to obtain ohmic electrodes. The resultant wafer is cleaved to produce semiconductor laser elements.

Figure 2:
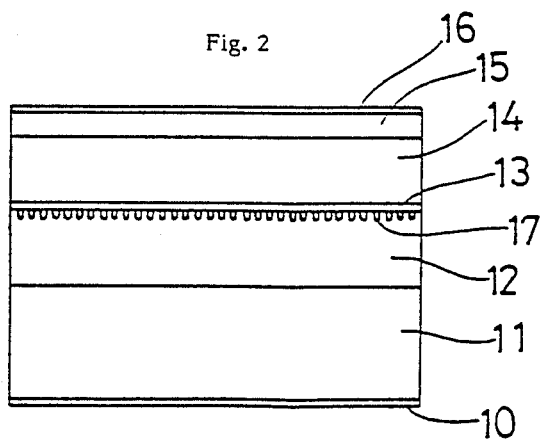
FIG. 2 is a side view of a distributed feedback type semiconductor laser element of another embodiment of the present invention.

FIG. 2 is a side view of a distributed feedback type semiconductor laser element of a second embodiment of the present invention. According to the second embodiment, an n-type clad layer 12 is grown on an n-type InP substrate 11 that has been carefully cleaned, and Fe ions are shot in the n-type clad layer 12 by the FIB method to form high resistance regions 17 vertically to the light propagating direction at almost the same interval as the laser light wavelength. The Fe ions are shot to a depth of 0.1 to 0.2 μm so that the Fe ions are not diffused. An undoped InGaAsP active layer 13, a p-type InP clad layer 14 and a p-type InGaAsP contact layer 15 are sequentially grown on the n-type clad layer 12 on which the high resistance regions 17 have been formed in the normal liquid phase growth method. Electrodes 10 and 16 are formed and a semiconductor laser element is obtained.

In the above two embodiments, the invention is applied to an InGaAsP/InP type semiconductor laser element. Needless to say, the present invention is applicable to other types of semiconductor laser elements such as GaAlAs/GaAs type and InGaP/InGaAlP/GaAs type. Further, the above embodiments of the present invention use Fe ions that the injected into the clad layer. Other ions may be used if they can form a high resistance region and if they can be sufficiently focused. The high resistance regions may be grown selectively on the clad layer either by using an oxide film or by a combination of light irradiation and an organic metal gas phase growth method in place of the FIB method.

While only certain embodiments of the present invention have been described, it will be apparent to those skilled in the art that various changes and modifications may be made therein without departing from the spirit and scope of the present invention as claimed.

What is claimed is:

1. A distributed feedback semiconductor laser device comprising:
   a substrate;
   a first clad layer formed on a top surface of said substrate;
   an active layer formed on said first clad layer;
   a second clad layer formed on said active layer;
   a plurality of high resistance regions formed in said second clad layer, each said plurality of high resistance regions being separated by a predetermined lateral distance and extending into said second clad layer a predetermined vertical depth;
   a third clad layer formed over said second clad layer and said plurality of high resistance regions;
   a contact layer formed on said third clad layer;
   a first electrode formed on a bottom surface of said substrate;
   a second electrode formed on said contact layer; and
   current injection means for injecting current into the distributed feedback semiconductor laser device so that the distributed feedback semiconductor laser device oscillates in a single longitudinal mode.

2. The distributed feedback semiconductor laser device of claim 1 wherein said substrate and said first clad layer are formed of a p-type material, said active layer is formed of an undoped material, and said second layer, said third clad layer and said contact layer are formed of an n-type material.

3. A distributed feedback semiconductor laser device comprising:
   a layered semiconductor structure for use in a semiconductor laser comprising,
   a substrate;
   a first clad layer formed on a top surface of said substrate;
   a plurality of high resistance regions formed in said first clad layer, each said plurality of high resistance regions being separated by a predetermined lateral distance and extending into said first clad layer a predetermined vertical depth;
   an active layer formed over said first clad layer and said plurality of high resistance regions;
   a second clad layer formed on said active layer;
   a contact layer formed on said second clad layer;
   a first electrode formed on a bottom surface of said substrate;
   a second electrode formed on said contact layer; and
   current injection means for injecting current into the distributed feedback semiconductor laser device so that the distributed feedback semiconductor laser device oscillates in a single longitudinal mode.

4. The distributed feedback semiconductor device of claim 3, wherein said substrate and said first clad layer are formed of an n-type material, said active layer is formed of an undoped material and said second clad layer and said contact layer are formed of a p-type material.

5. The distributed feedback semiconductor device of claim 1, wherein said plurality of high resistance regions are formed by injecting ions into said second clad layer.

6. The distributed feedback semiconductor device of claim 3, wherein said plurality of high resistance regions are formed by injecting ions into said first clad layer.

7. The distributed feedback semiconductor device of claim 2, wherein said substrate is formed of p-type InP.

8. The distributed feedback semiconductor device of claim 2, wherein said first clad layer is formed of p-type InP.

9. The distributed feedback semiconductor device of claim 2, wherein said active layer is formed of undoped InGaAsP.

10. The distributed feedback semiconductor device of claim 2, wherein said second clad layer is formed of n-type InP.

11. The distributed feedback semiconductor device of claim 2, wherein said third clad layer is formed of n-type InP.

12. The distributed feedback semiconductor device of claim 2, wherein said contact layer is formed of n-type InGaAsP.

13. The distributed feedback semiconductor device of claim 5, wherein said plurality of high resistance regions are formed by injecting Fe ions.

14. The distributed feedback semiconductor device of claim 6, wherein said plurality of high resistance regions are formed by injecting Fe ions.

15. The distributed feedback semiconductor device of claim 1, wherein said first electrode is formed of Au/Zn.

16. The distributed feedback semiconductor device of claim 1, wherein said second electrode is formed of Au/Ge/Ni.

17. The distributed feedback semiconductor device of claims 4, wherein said substrate is formed of n-type InP.

18. The distributed feedback semiconductor device of claim 4, wherein said first clad layer is formed of n-type InP.

19. The distributed feedback semiconductor device of claim 4, wherein said active layer is formed of undoped InGaAsP.

20. The distributed feedback semiconductor device of claim 4, wherein said second clad layer is formed of p-type InP.

21. The distributed feedback semiconductor device of claim 4, wherein said contact layer is formed of p-type InGaAsP.

22. A layered semiconductor structure for use in a distributed feedback semiconductor laser comprising:
a substrate;
a first clad layer formed on a top surface of said substrate;
an active layer formed on said first clad layer;
a second clad layer formed on said active layer;
a plurality of high resistance regions formed in said second clad layer, each said plurality of high resistance regions being separated by a predetermined lateral distance and extending into said second clad layer a predetermined vertical depth; and
a third clad layer formed over said second clad layer and said plurality of high resistance regions.

23. The layered semiconductor device of claim 22, wherein said substrate and said first clad layer are formed of a p-type material, said active layer is formed of an undoped material and said second and third clad layers are formed of an n-type material.

24. The layered semiconductor structure of claim 23, wherein said substrate is formed of p-type InP.

25. The layered semiconductor structure of claim 23, wherein said first clad layer is formed of p-type InP.

26. The layered semiconductor structure of claim 23, wherein said active layer is formed of undoped InGaAsP.

27. The layered semiconductor structure of claim 23, wherein said second clad layer is formed of n-type InP.

28. The layered semiconductor structure of claim 23, wherein said third clad layer is formed of n-type InP.

29. The layered semiconductor structure of claim 22, wherein said plurality of high resistance regions are formed by injecting ions into said second clad layer.

30. The layered semiconductor structure of claim 29, wherein said plurality of high resistance regions are formed by injecting Fe ions.

31. A layered semiconductor structure for use in a distributed feedback semiconductor laser comprising:
a substrate;
a first clad layer formed on a top surface of said substrate;
a plurality of high resistance regions formed in said first clad layer, each said plurality of high resistance regions being separated by a predetermined lateral distance and extending into said first clad layer a predetermined vertical depth;
an active layer formed over said first clad layer and said plurality of high resistance regions; and
a second clad layer formed on said active layer.

32. The layered semiconductor structure of claim 31, wherein said substrate and said first clad layer are formed of an n-type material, said active layer is formed of an undoped material and said second clad layer is formed of a p-type material.

33. The layered semiconductor structure of claim 32, wherein said substrate is formed of n-type InP.

34. The layered semiconductor structure of claim 32, wherein said first clad layer is formed of n-type InP.

35. The layered semiconductor structure of claim 32, wherein said active layer is formed of undoped InGaAsP.

36. The layered semiconductor structure of claim 32, wherein said second clad layer is formed of p-type InP.

37. The layered semiconductor structure of claim 31, wherein said plurality of high resistance regions are formed by injected ions into said first clad layer.

38. The layered semiconductor structure of claim 37, wherein said plurality of high resistance regions are formed by injecting Fe ions.

* * * * *